United States Patent
Ali et al.

(10) Patent No.: US 10,207,491 B2
(45) Date of Patent: *Feb. 19, 2019

(54) METHOD FOR PREPARING FLEXOGRAPHIC PRINTING PLATES

(71) Applicant: Eastman Kodak Company, Rochester, NY (US)

(72) Inventors: M. Zaki Ali, Mendota Heights, MN (US); Richard R. Ollmann, Jr., Woodbury, MN (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/718,357

(22) Filed: Sep. 28, 2017

(65) Prior Publication Data

US 2018/0134030 A1  May 17, 2018

Related U.S. Application Data

(63) Continuation-in-part of application No. 15/352,663, filed on Nov. 16, 2016.

(51) Int. Cl.
| | |
|---|---|
| *G03F 7/20* | (2006.01) |
| *B41C 1/00* | (2006.01) |
| *B41C 1/10* | (2006.01) |
| *G03F 7/004* | (2006.01) |
| *G03F 7/24* | (2006.01) |

(52) U.S. Cl.
CPC ............ *B41C 1/003* (2013.01); *B41C 1/1016* (2013.01); *B41C 1/1075* (2013.01); *G03F 7/004* (2013.01); *G03F 7/202* (2013.01); *G03F 7/2012* (2013.01); *G03F 7/24* (2013.01); *B41C 2210/04* (2013.01); *B41C 2210/06* (2013.01); *B41C 2210/12* (2013.01); *B41C 2210/24* (2013.01); *B41C 2210/266* (2013.01)

(58) Field of Classification Search
CPC ........................................................ G03F 7/34
See application file for complete search history.

(56) References Cited

U.S. PATENT DOCUMENTS

| | | |
|---|---|---|
| 5,115,011 A | 10/1992 | Zertani et al. |
| 5,115,012 A | 10/1992 | Joerg et al. |

(Continued)

*Primary Examiner* — Chanceity N Robinson
(74) *Attorney, Agent, or Firm* — J. Lanny Tucker

(57) ABSTRACT

Flexographic printing members are prepared from a flexographic printing plate precursor consisting essentially of: backing film, water- or water-dispersible photosensitive layer, and cover sheet in contact with the photosensitive layer. The cover sheet is removed and a mask element is laminated directly in contact with the photosensitive layer. Exposure through the mask element provides exposed regions and non-exposed regions. The non-exposed regions are removed with an aqueous developer having: a) a $C_{12-20}$ saturated or unsaturated fatty acid (or alkali metal salt) at 0.25-2.0 weight %, and at least 85 weight % of a $C_{18}$ mono- or poly-unsaturated fatty acid (or alkali metal salt); b) an aminopolycarboxylic acid (or alkali metal salt) at 0.05-0.30 weight %; c) a buffer at 05-0.60 weight %; and d) water. The photosensitive layer has a controlled release of 5-500 g/cm using ASTM D-3330 Method D, between its front imaging surface and the mask element.

15 Claims, 1 Drawing Sheet

(56) References Cited

U.S. PATENT DOCUMENTS

| | | |
|---|---|---|
| 7,226,709 B1 | 6/2007 | Kidnie et al. |
| 7,348,123 B2 | 3/2008 | Mengel et al. |
| 8,142,987 B2 | 3/2012 | Ali et al. |
| 8,257,913 B2 | 9/2012 | Adachi et al. |
| 8,492,449 B2 | 7/2013 | Inoue et al. |
| 8,530,117 B2 | 9/2013 | Ali et al. |
| 8,632,961 B2 | 1/2014 | Fohrenkamm et al. |
| 8,771,925 B2 | 7/2014 | Fohrenkamm et al. |
| 8,945,813 B2 | 2/2015 | Kidnie |
| 9,005,884 B2 | 4/2015 | Yawata et al. |
| 9,250,527 B2 | 2/2016 | Kidnie |
| 2003/0022104 A1 | 1/2003 | Takano et al. |
| 2007/0117039 A1 | 5/2007 | Wada et al. |
| 2012/0237871 A1* | 9/2012 | Zwadlo .................. B41C 1/05 430/270.1 |
| 2012/0288682 A1 | 11/2012 | Inque et al. |
| 2013/0288185 A1* | 10/2013 | Yawata .................. G03F 7/322 430/436 |
| 2015/0299624 A1 | 10/2015 | Himmrich et al. |

\* cited by examiner

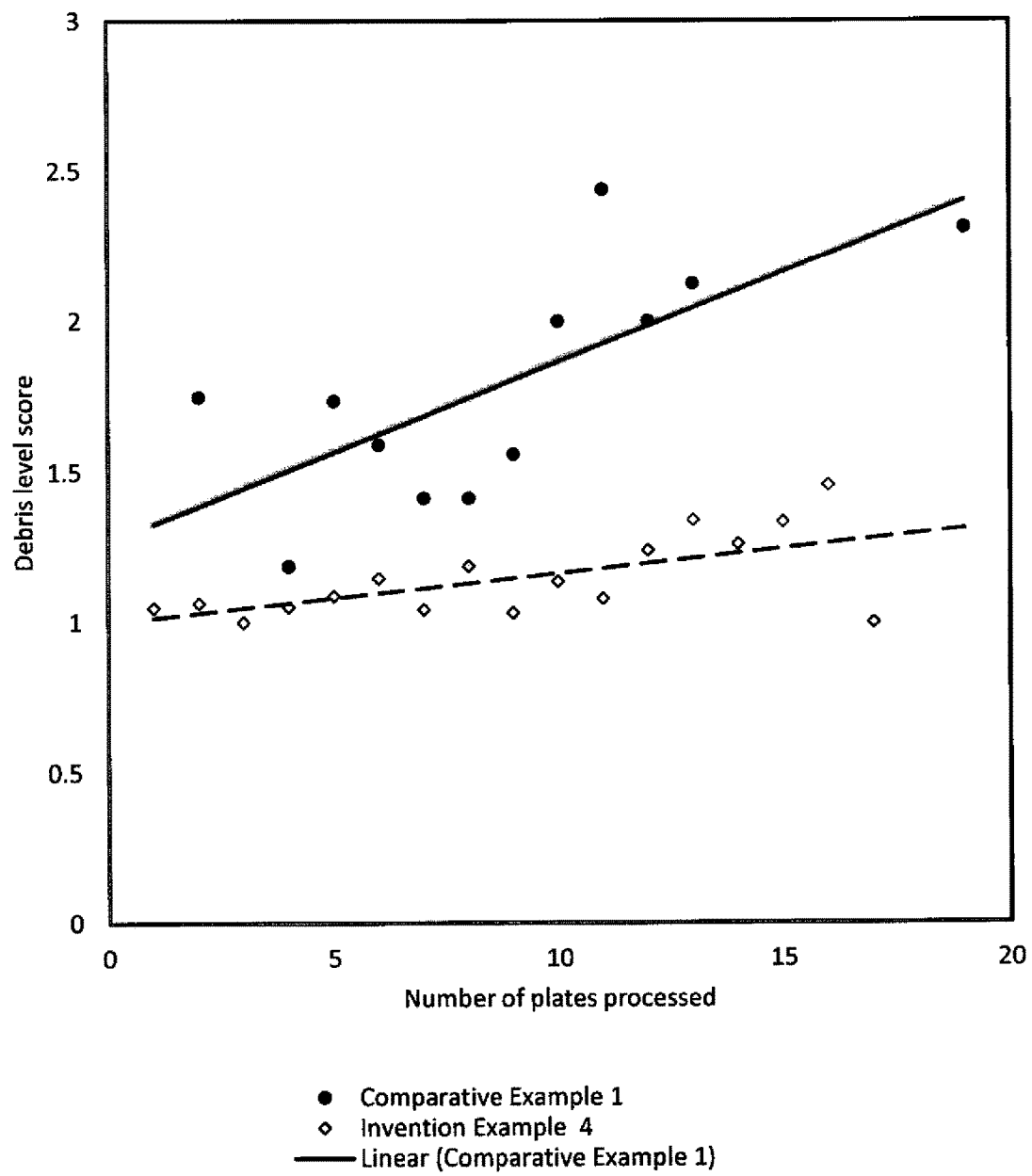

METHOD FOR PREPARING FLEXOGRAPHIC PRINTING PLATES

RELATED APPLICATIONS

Reference is made to the following commonly assigned and copending patent applications, the disclosures of which are incorporated herein by reference:

U.S. Ser. No. 15/352,663 filed Nov. 16, 2016 of which the present application is a continuation-in-part;
U.S. Ser. No. 15/352,666 filed Nov. 16, 2106;
U.S. Ser. No. 15/196,122 filed Jun. 29, 2016; and
U.S. Ser. No. 15/196,132 filed Jun. 29, 2016.

FIELD OF THE INVENTION

This invention relates to a method for preparing flexographic printing plates from suitable precursors, and processing the imaged precursor using a unique aqueous flexographic developer to provide a relief image. The noted precursor has a water-soluble or water-dispersible photosensitive layer that exhibits "controlled release" of a least 5 g/cm and up to and including 500 g/cm as established by ASTM D-3330 Method D, in relation to a surface of the photosensitive layer and a mask element.

BACKGROUND OF THE INVENTION

The production of relief images for flexographic printing is generally carried out by imagewise exposing the photosensitive layer of a flexographic printing precursor using suitable imaging radiation such as UV radiation. Unexposed areas of the photosensitive layer are washed off (developed or "washed out") using a suitable developer or processing solution while exposed, and crosslinked areas are left intact. Residual developer is generally removed by evaporation and if necessary, the developed surface is treated to remove tackiness. A resulting flexographic printing plate having a relief image can be wrapped around a cylinder on a printing press and used to transfer ink to a suitable substrate composed of various papers, polymeric films, fabrics, ceramics, and other materials. Alternatively, the resulting flexographic printing member can be a flexographic printing sleeve that is slid onto a suitable mandrel and used to similarly transfer ink to a substrate.

However, for a variety of environmental and safety concerns, there has been a strong incentive in the industry to avoid the use of solvent-based developers and to find aqueous-based flexographic developers that will provide the same quality of processing as organic solvent-based developers while avoiding environmental concerns associated therewith. This has been difficult to achieve because of the nature of various photopolymer compositions designed for flexographic printing precursors. Not just any type of aqueous solution, with or without water-miscible organic solvents will meet all of the rigorous processing and performance requirements.

For example, it is necessary that effective processing of an imagewise exposed flexographic printing precursor remove all of the non-exposed photopolymer, leaving relief images with well-defined boundaries (high resolution) and appropriate relief depth. Not just any developer, aqueous or non-aqueous, can be effective with a given photopolymer composition.

Moreover, as an aqueous flexographic developer is used continuously to process numerous imagewise exposed precursors, the pH of the developer can change thereby causing more photopolymer components dispersed therein to come out of solution and to re-deposit on the surface of the relief image. This reduces relief image resolution and results in serious image defects during printing. Such dispersed photopolymer components also can stick to brushes used during processing and cause "scum" on the relief image member. This problem increases as the developer pH becomes more acidic.

U.S. Patent Application Publication 2007/0117039 (Wada et al) and U.S. Pat. No. 8,492,449 (Inoue et al.) describe aqueous developers used for solubilizing non-exposed photopolymer compositions, which aqueous developers include one or more nonionic or anionic surfactants and a suitable pH controlling agent.

U.S. Pat. No. 9,005,884 (Yawata et al.) proposes to solve such problems with an aqueous flexographic developer that comprises both saturated and unsaturated fatty acids at a 20:80 to 80:20 weight ratio, along with an alkali agent. Depending upon the particular ratio of saturated and unsaturated fatty acids, such compositions (also known as "soaps") may not sufficiently "develop" the exposed flexographic printing precursors, thereby leaving debris on the resulting flexographic printing plate, leading to severe printing defects in the resulting impressions.

In addition, it has been found that as the pH of such aqueous developers becomes more acidic with continuous use, fatty acids incorporated therein are converted from their basic (ionic) form to their acidic form and their solubility in water and ability to form micelles are seriously reduced. When this happens, the debris from the non-exposed photopolymer is less solubilized in the absence of appropriate micelles. Both precipitated (solid) fatty acids and photopolymer debris float throughout the aqueous flexographic developer, collect on brushes used during processing, and end up as scum on the relief image of the printing plate. These are unacceptable results in the industry and it to address these problems that the present invention is directed.

Moreover, it has been found that the most effective use of an aqueous developer can be dependent upon the particular photosensitive flexographic printing plate precursor that is used. Thus, there is a need to design a combination of a photosensitive flexographic printing plate precursor, a masking element, and an aqueous developer that can provide the optimum imaging and development functions in providing the desired relief images.

SUMMARY OF THE INVENTION

The present invention provides a method for forming a flexographic printing plate, comprising:

A) providing a flexographic printing plate precursor consisting essentially of:
   a backing film,
   a water-soluble or water-dispersible photosensitive layer comprising a photosensitive resin composition and having a front imaging surface and a backside imaging surface that is in contact with the backing film, and
   a cover sheet directly in contact with the front imaging surface;

B) removing the cover sheet from the front imaging surface of the photosensitive layer;

C) laminating a mask element directly in contact with the front imaging surface of the water-soluble or water-dispersible photosensitive layer;

D) frontside imagewise exposing the photosensitive layer through the mask element and front imaging surface to provide an exposed photosensitive layer having exposed regions and non-exposed regions; and E) processing the exposed photosensitive layer to remove non-exposed regions in the exposed photosensitive layer, using an aqueous flexographic developer having a pH of at least 9 and up to and including 12 and comprising:
   a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 0.25 weight % and up to and including 2.0 weight %;
   wherein at least 85 weight % of the fatty acid composition is composed of one or more $C_{18}$ mono- or poly-unsaturated fatty acids or alkali metal salts thereof;
   b) one or more aminopolycarboxylic acids or alkali metal salts thereof in an amount of at least 0.05 weight % and up to and including 0.30 weight %;
   c) a buffer compound in an amount of at least 0.05 weight % and up to and including 0.60 weight %; and
   d) water in an amount of at least 97 weight % and up to and including 99.5 weight %;
   all amounts being based on the total weight of the aqueous flexographic developer,
   to provide a flexographic printing plate with a relief image,
   wherein the water-soluble or water-dispersible photosensitive layer has a controlled release of at least 5 g/cm and up to and including 500 g/cm as established by ASTM D-3330 Method D, between the front imaging surface and the mask element.

The present invention provides a method in which a unique combination of flexographic printing plate precursor, mask element, and aqueous flexographic developer are used to effectively provide flexographic printing plates in a more environmentally acceptable manner.

BRIEF DESCRIPTION OF THE DRAWING

FIG. 1 is a graphical representation of data for debris vs. processed flexographic printing plates obtained from some of the working examples described below.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any embodiment.
Definitions As used herein to define various components of the working strength aqueous flexographic developers, flexographic developer concentrates, and other materials used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

The aqueous flexographic developers used according to the present invention are sometimes known as "washout" solutions or "processing solutions".

The fatty acid compositions used in the present invention are sometimes known in the art as "soaps" because they consist of one or more fatty acids or various chemical compositions and concentrations. Such fatty acid compositions can be in either liquid, gel, or solid form.

Unless otherwise indicated herein, the terms "concentrate," "concentrated flexographic developer," and "concentrated aqueous flexographic developer" are meant to refer to the same composition or solution.

Unless otherwise indicated herein, the terms "photosensitive relief image precursor," "flexographic printing member precursor," and "precursor" are meant to refer to the same article.
Use of Invention The method of the present invention are useful for preparing flexographic printing members such as flexographic printing plates or flexographic printing sleeves, after the appropriate flexographic printing precursors have been appropriately imaged and processed (developed).

In general, flexographic printing members can be formed after imaging a suitable flexographic printing precursor to provide latent images by applying an aqueous developer or processing composition according to the present invention. For example, some useful precursors are described in U.S. Pat. No. 8,492,449 (Inoue et al.), the disclosure of which is incorporated herein by reference, as well as other references cited below. Before this processing is carried out, the latent image can be formed in the precursor using any appropriate method known in the art, for example using a mask element as described in U.S. Pat. No. 9,250,527 (Kidnie et al)., the disclosure of which is incorporated herein by reference.
Flexographic Developers (Working Strength and Concentrates)

The flexographic developers used according to the present invention can be manufactured, provided for use, and potentially used either in an aqueous "working strength" form with diluted component concentrations, or as flexographic developer concentrates that can be either in solid or liquid form. Practically speaking, however, the concentrates are generally prepared in manufacturing and sold to users that typically dissolve the concentrates in water or dilute the concentrates using suitable dilution rates to provide useful working strength compositions for a typical flexographic printing environment and equipment. While the components making up both working strength and concentrated flexographic developers are generally the same, their amounts, composition pH, composition viscosity, and other composition properties can be the same or different.

In the following discussion, the various components that are common to both working strength and concentrated flexographic developers will be described, followed by specific discussions of the features relating to the working strength aqueous flexographic developers and the flexographic developer concentrates.

Fatty Acid Composition:

An essential component of both the aqueous flexographic developers and the flexographic developer concentrates is a "fatty acid composition" that consists of one or more saturated or unsaturated fatty acids (or alkali metal salts thereof). It is to be understood that within the aqueous flexographic developers described herein (and in the "fatty acid composition"), the fatty acids described below can be present in protonated form or ionic form, or both protonated and ionic forms in varying amounts, depending upon pH.

Each of these saturated or unsaturated fatty acids (or alkali metal salts thereof) independently have 12 to 20 carbon atoms. When multiple saturated or unsaturated fatty acids (or alkali metal salts thereof) are present, they can have the same or different number of carbon atoms. The alkali metal salts of the fatty acids can be sodium, potassium, or lithium salts, or a mixture of such salts. Typically, potassium salts are desirable and can be obtained by mixing potassium ions (such as in the form of potassium hydroxide) with the fatty acids.

It is essential for providing the advantages of the present invention that least 85 weight % and up to and including 100 weight % of the total weight of the fatty acid composition consists of one or more mono- or poly-unsaturated fatty acids (or alkali metal salts thereof). In particular, such unsaturated fatty acids are $C_{12}$ to $C_{20}$ mono- or poly-unsaturated fatty acids (or alkali metal salts thereof). In many embodiments, the one or more mono- or poly-unsaturated fatty acids (or alkali metal salts thereof) are present in an amount of at least 85 weight % and up to and including 95 weight %, or even at least 85 weight % and up to and including 90 weight %, based on the total weight of the fatty acid composition. The poly-unsaturated fatty acids (or alkali metal salts thereof) are generally di- and tri-unsaturated fatty acids and the di-unsaturated fatty acids (or alkali metal salts thereof) are particularly useful.

Representative useful saturated fatty acids (and alkali metal salts thereof) having 12 to 20 carbon atoms include but are not limited to, lauric acid, sodium laurate, potassium laurate, myristic acid, sodium myristate, potassium myristate, palmitic acid, sodium palmitate, potassium palmitate, stearic acid, sodium stearate, and potassium stearate. Mixtures of two or more of these fatty acids (or alkali metal salts thereof) can be used if desired. One or more potassium salts of such saturated fatty acids are particularly useful.

Representative useful unsaturated fatty acids (including mono- and polyunsaturated compounds) and alkali metal salts thereof having 12 to 20 carbon atoms include but are not limited to, palmitoleic acid, sodium palmitoleate, potassium palmitoleate, oleic acid, sodium oleate, potassium oleate, linolenic acid, sodium linoleate, potassium linoleate, linolenaic acid, sodium linolenate, potassium linolenate, ricinoleic acid, sodium ricinoleate, potassium ricinoleate, arachidonic acid, sodium arachidonate, and potassium arachidonate. The potassium salts of such mono- and poly-unsaturated fatty acids are particularly useful. In some embodiments, oleic acid, sodium oleate, or potassium oleate, or a mixture thereof, is present as the unsaturated fatty acid, and such unsaturated fatty acids (or alkali metal salts thereof) can comprise at least 85 weight % and up to and including 100 weight % of the total weight of the fatty acid composition. Mixtures of various mono- or poly-unsaturated fatty acids (or alkali metal salts thereof) can also be used.

From the noted examples of useful fatty acids and alkali metal salts thereof, any of the saturated or unsaturated fatty acids useful in this invention can be neutralized with an alkali metal agent such as sodium hydroxide or potassium hydroxide.

As noted above, the fatty acid composition consists predominantly (at least 85 weight %) of one or more mono- or poly-unsaturated fatty acids. Thus, the weight ratio of unsaturated fatty acids to saturated fatty acids (when present) can be from 5.67:1 to about 999:1.

Both saturated and unsaturated fatty acids (or alkali metal salts thereof) useful in the present invention can be obtained from various commercial sources, or prepared using known starting materials and chemical syntheses that would be readily apparent to one skilled in the art.

Aminopolycarboxylic Acids:

A second essential component in the aqueous flexographic developers and flexographic developer concentrates is one or more aminopolycarboxylic acids or salts thereof (such as alkali metal salts). Such compounds comprise one or more amino groups and two or more carboxylic acid groups (or salt groups) in the same molecule. Such compounds are sometimes known in the art as chelating agents and have previously been used in the photographic industry, when complexed with ferric ions, as bleaching agents.

Useful compounds of this type include but are not limited to, ethylenediamine tetraacetic acid (or salts thereof) known in the art as EDTA (or salt thereof), propylenediamine tetraacetic acid (or salts thereof) known in the art as PDTA or other alkylenediamine tetraacetic acids (or salts thereof); diethylenetriamine pentaacetic acid (or salts thereof); o-diamine cyclohexane tetraacetic acid (or salts thereof); ethylene glycol bis(aminoethyl ether) tetraacetic acid (or salts thereof); diaminopropanol tetraacetic acid (or salts thereof); N-(2-hydroxyethyl)ethylenediamine triacetic acid (or salts thereof); nitrilotriacetic acid (or salts thereof) known in the art as NTA; iminodiacetic acid (or salts thereof) known in the art as ITA; ethyliminodipropionic acid (or salts thereof) known in the art as EIDPA, or other alkyliminodipropionic acids (or salts thereof); methyliminodiacetic acid (or salts thereof) known in the art as MIDA, ethyliminodiactic acid (or salts thereof) known in the art as EIDA, or other alkyliminodiacetic acids (or salts thereof); and other compounds that would be readily apparent to one skilled in the art from these representative compounds. The sodium or potassium salts of EDTA are particularly useful.

Mixtures of these various compounds can be used if desired.

Useful aminopolycarboxylic acids (or salts thereof) can be obtained from various commercial sources or prepared using known starting materials and chemical syntheses that would be readily apparent to one skilled in the art.

Buffer Compounds:

A third essential component of the aqueous flexographic developers and flexographic developer concentrates is a buffer compound (or mixture thereof) that helps to maintain the desired pH during storage and use. Useful buffer compounds can be chosen by a skilled worker by consulting literature describing known compounds having buffer capacity and the pH range in which they are effective and matching such compounds to the pH conditions desired for the present invention. For example, representative buffer compounds useful in the present invention include but are not limited to, a carbonate (such as potassium carbonate or sodium carbonate), sodium tetraborate, potassium tetraborate, sodium phosphate, and potassium phosphate. Such materials are readily available from various commercial sources.

Water:

Water is obviously essential to the aqueous flexographic developers and the flexographic developer concentrates provided in liquid form and is the predominant solvent used therein. This means that organic solvents (both water-miscible and water-immiscible organic solvents) are generally present only in minor amounts or particularly in an amount of less than 10 weight % of the total aqueous flexographic developer or flexographic developer concentrate weight, and in most embodiments, such organic solvents are present in an amount of 0 weight % and up to and including 5 weight %, based on the total flexographic developer weight (whether in liquid or solid form). Any suitable quality of water can be used, but generally, the water is deionized water or water obtained using distillation or reverse osmosis.

Optional Addenda:

Materials that are optional but that can be included in the aqueous flexographic developers or flexographic developer concentrates for certain purposes include glycol and poly-glycol mono-ether co-solvents, enzymes, fluorescent whitening agents, perfumes, biocide, fungicides, defoaming agents, colorants, bleach, bleach activators, and surfactants.

For example, one or more glycol and poly-glycol mono-ether co-solvents can be present in each type of composition, which compounds generally have a molecular weight of less than 150, are water-soluble, and have at least one hydroxy group. One useful compound of this type is propylene glycol butyl ether that can be obtained as DOWANOL® PnB from Dow Chemical Company. Such glycol and poly-glycol mono-ether co-solvents can be present in an amount of at least 0.05 weight % and up to and including 0.30 weight %, based on the total weight of the aqueous flexographic developer. The amount of the glycol and poly-glycol mono-ether co-solvents in the flexographic developer concentrates (solid or liquid form) can be readily determined based on the dissolution rate or dilution rate of a liquid concentrate to provide the desired working strength aqueous flexographic developers. Typically, the amount of the one or more glycol and poly-glycol mono-ether-co-solvents in the concentrates is at least 1.5 weight % and up to and including 15 weight %, based on the total weight of flexographic developer concentrate. Other useful glycols and poly-glycol mono-ethers include but are not limited to, 2-phenoxyethanol, 1-ethoxy-2-propanol, 2-methoxypropanol, diethylene glycol monobutyl ether, 2-butoxyethanol, and propylene glycol propyl ether.

Working Strength Aqueous Flexographic Developers:

In general, at working strength, each aqueous flexographic has a pH of at least 9.5 and up to and including 11.5, more likely of at least 9.8 and up to and including 11.2, or most likely of at least 10.1 and up to and including 10.5. It is desirable to keep the pH of such working strength aqueous flexographic developers during use within ±0.5 of the original pH (pH when processing is begun). The aqueous flexographic developers used according to the present invention generally exhibit improved pH stability upon storage and use.

Since the amounts of the various components (described below) in the working strength aqueous flexographic developers are quite low, the viscosity of the working strength composition does not significantly vary from that of water.

The fatty acid composition described above is generally present in the working strength aqueous flexographic developers in an amount of at least 0.25 weight % and up to and including 2.0 weight %, or of at least 0.5 weight % and equal to or less than 1.25 weight %, based on the total weight of the aqueous flexographic developer.

The one or more aminopolycarboxylic acids (or salts thereof) described above can be present in the working strength aqueous flexographic developer in an amount of at least 0.05 weight % and up to and including 0.30 weight %, or more likely of at least 0.05 and up to and including 0.25 weight %, based on the total weight of the aqueous flexographic developer.

One or more buffer compounds are generally present in the working strength aqueous flexographic developers in suitable amounts to maintain the desired pH. For example, they can be present in an amount of at least 0.05 weight % and up to and including 0.60 weight %, or at least 0.20 weight % and up to and including 0.60 weight %, based on the total weight of the aqueous flexographic developer.

Water is generally present in the working strength aqueous flexographic developers in an amount of at least 97 weight % and up to and including 99.5 weight %, or even at least 97.5 weight % and up to and including 99.0 weight %, based on the total weight of the aqueous flexographic developer.

Flexographic Developer Concentrates:

Each flexographic developer concentrate (in liquid form) can have a pH that is the same as or different from that working strength aqueous flexographic developer that is formed upon dilution. In general, each concentrate can have a pH of at least 9.5 and up to and including 11.5, more likely of at least 9.8 and up to and including 11.2, or most likely of at least 10.3 and up to and including 10.9.

The viscosity of each concentrate can be at least 100 centipoises (0.1 Pascal sec) and up to and including 900 centipoises (0.9 Pascal sec), or more likely at least 300 centipoises (0.3 Pascal sec) and up to and including 600 centipoises (0.6 Pascal sec), all measured using a standard viscometer at 25° C.

The fatty acid composition described above is generally present in the concentrate in an amount of at least 10 weight % and up to and including 60 weight %, or even at least 12 weight % and equal to or less than 25 weight %, based on the total weight of the concentrate.

The one or more aminopolycarboxylic acids (or salts thereof) described above can be present in the concentrate in an amount of at least 1.5 weight % and up to and including 15 weight %, or more likely of at least 1.5 and up to and including 10 weight %, based on the total weight of the flexographic developer concentrate.

One or more buffer compounds are generally present in the flexographic developer concentrate in suitable amounts to maintain the desired pH. For example, they can be present in an amount of at least 3.5 weight % and up to and including 25 weight %, or at least 4 weight % and up to and including 8 weight %, based on the total weight of the flexographic developer concentrate.

The amount of water in the flexographic developer concentrates, if in liquid form, is determined by considering the dilution ratio needed to provide a suitable working strength aqueous flexographic developer as described above, or to provide a suitable replenisher concentration (as described below). In general, the amount of water in the concentrates can be up to and including 85 weight %, or at least 60 weight % and up to and including 80 weight %, based on the total weight of the flexographic developer concentrates in liquid form.

The aqueous flexographic developers used according to the present invention can be prepared by any method wherein the three essential components described above and any optional addenda are added to water in any desirable order and the resulting solution or composition is then stirred to provide homogenization. The mixing method can be carried out at any suitable temperature that does not deteriorate the composition or its utility to process exposed flexographic printing member precursors. The essential components and optional addenda can be incorporated in water in suitable amounts to form either a concentrate (in liquid form) or a working strength composition of any desired concentration and viscosity.

Solid form flexographic developer concentrates can be prepared by allowing a fatty acid (or mixture thereof) and an alkali metal base to react in water, evaporating the water, adding the remaining desired components, and pulverizing the resulting dry composition. Thus, water is absent and the solid concentrate can then be dissolved in a suitable amount of water and mixed to provide any of i) a desired aqueous flexographic developer, ii) a liquid form flexographic developer concentrate; iii) a replenisher developer composition, or iv) a replenisher developer concentrate.

Forming Flexographic Printing Members

To provide a flexographic printing member such a flexographic printing plate or flexographic printing sleeve, containing a relief image, a suitable flexographic printing plate precursor ("precursor", having a photosensitive layer, as described below) is frontside imagewise exposed (as described below), after removal of a cover sheet and lamination of a mask element to the precursor, followed by suitable processing using an aqueous flexographic developer to remove non-exposed regions of the exposed photosensitive layer to provide the relief image.

Useful flexographic printing plate precursors are described in more detail below in reference to the formation of flexographic printing plates but it is to be understood that the flexographic printing sleeves can be similarly prepared.

Flexographic printing plate precursors and their various structure and composition are described in U.S. Pat. No. 8,142,987 (Ali et al.), U.S. Pat. No. 7,226,709 (Kidnie et al.), U.S. Pat. No. 7,348,123 (Mengel et al.), U.S. Pat. No. 8,492,449 (noted above), U.S. Pat. No. 8,945,813 (Kidnie), and U.S. Pat. No. 9,005,884 (noted above), and U.S. Patent Application Publication 2007/0117039 (Wada et al.), the disclosures of all of which are incorporated herein by reference.

Such useful precursors generally have as essential components: a backing film, a water-soluble or water-dispersible photosensitive layer ("photosensitive layer") comprising one or more photosensitive resins, and having a front imaging surface and a backside imaging surface that is in contact with the backing film; and a cover sheet directly in contact with the front imaging surface of the photosensitive layer.

Suitable backing layers for such precursors can also be considered a "support" or "substrate" and is generally composed of a suitable dimensionally stable material such as a polymeric film or aluminum sheet, but polymeric films including polyesters such as poly(ethylene terephthalate) and poly (ethylene naphthalate) are particularly useful when backside exposure is also desired.

An adhesive layer is optionally present on the backing layer to increase adhesion of the backing layer to the backside imaging surface of the water-soluble or water-dispersible photosensitive layer.

Photosensitive layers useful in the present invention can be designed using various photosensitive or photopolymerizable elastomers or a photosensitive elastomeric composition. By "photosensitive" or "photopolymerizable," is meant that the elastomeric composition is polymerizable or crosslinkable from irradiation by suitable radiation, or both polymerizable and crosslinkable. The photosensitive elastomeric composition generally includes a thermoplastic binder, at least one monomer and an initiator (photoinitiator) that is sensitive to suitable radiation such as visible or UV radiation, or both. Suitable initiator compositions include but are not limited to those described in U.S. Pat. No. 4,323,637 (Chen et al.), U.S. Pat. No. 4,427,749 (Gruetzmacher et al.), and U.S. Pat. No. 4,894,315 (Fienberg et al.), the disclosure of all of which are incorporated herein by reference. Photoinitiators can include but are not limited to, compounds that generate free radicals upon exposure to actinic radiation such as quinones, benzophenones, benzoin ethers, aryl ketones, peroxides, biimidazoles, benzyl dimethyl ketal, and others known in the art. Representative useful photoinitiators are described in Col. 5 (lines 44-55) of U.S. Pat. No. 8,492,449 (noted above).

The thermoplastic binder can be one or more polymers or resins that are water-soluble or water-dispersible, especially in the aqueous flexographic developers described herein according to the present invention. Various polymeric binders having such properties are known in the art as described in the publications noted in the preceding paragraph such as U.S. Pat. No. 8,492,449 (noted above). For example, such materials can comprise water-dispersible latexes composed of polymers such as a polybutadiene latex, a natural rubber latex, a styrene-butadiene copolymer latex, an acrylonitrile-butadiene copolymer latex, a polyurethane latex, a polychloroprene latex, a polyisoprene latex, a methyl methacrylate-butadiene copolymer latex, an acrylate-methyl methacrylate-butadiene latex, a vinyl pyridine polymer latex, a butyl polymer latex, a thiokol polymer latex, and an acrylate polymer latex, as well as a copolymer of one of the noted latex polymers and another component such as acrylic acid or methacrylic acid. These materials can be used individually or in mixtures. A water-dispersible latex that contains a butadiene skeleton or an isoprene skeleton in the molecular chain are particularly useful.

The photosensitive layer can also include one or more "rubbers" that act to increase the rubber elasticity of the photosensitive layer composition. Examples of useful rubber materials include but are not limited to, a butadiene rubber, a nitrile rubber, an acryl rubber, an epichlorohydrin rubber, a urethane rubber, an isoprene rubber, a styrene-isoprene rubber, a styrene-butadiene rubber, an ethylene-propylene copolymer, and a chlorinated polyethylene. Such rubbers can be used individually or in mixtures. A butadiene rubber or nitrile rubber are particularly useful.

The photosensitive layer composition can also include one or more surfactants to improve water dispersibility. While useful surfactants can be anionic, cationic, or non-ionic in nature, the anionic surfactants are particularly useful. Examples are provided in Col. 4 (lines 29ff) of U.S. Pat. No. 8,492,449 (note above).

The "monomer" is generally considered a compound that is compatible with the polymeric binder(s) and is capable of addition polymerization in response to irradiation with actinic radiation such as UV radiation. There can be a mixture of monomers if desired. They typically have a molecular weight less than 5000 although compounds with higher molecular weight can be used if desired. Useful monomers include but are not limited to, various acrylates, methacrylates, mono- and polyesters of alcohols and polyols such as polyacrylates and polymethacrylates, (meth)acrylic acid or oligomers such as (meth)acrylic acid modified butadiene rubbers or modified nitrile rubbers. The monomers can include one or a plurality of ethylenically unsaturated polymerizable bonds. Representative useful monomers are described in Col. 5 (lines 1-43) of U.S. Pat. No. 8,492,449 (noted above).

The photosensitive elastomeric imageable layer composition can also include various additives such as colorants, ultraviolet light absorbers, pigments, defoaming agents, infrared radiation absorbers, plasticizers, processing aids, antioxidants, thermopolymerization inhibitors, and antiozone agents as are known in the art. Useful plasticizers and amounts are described in Col. 6 (lines 51-64) of U.S. Pat. No. 8,492,449 (noted above).

The amounts of the various components of the photosensitive layer can be designed for a given utility but the particularly useful amounts are described for example in Col. 5 (line 56) to Col. 6, line 42) of U.S. Pat. No. 8,492,449 (noted above). For example, the amount of the water-dispersible latex can be determined in a molar ratio to the sum of the total weight of the water-dispersible latex and rubber(s), of at least 20% to and including 90%, or about least 30% to and including 80%. The amount of a useful surfactant(s) can be determined as a molar ratio to the sum of the total weight of the water-dispersible latex(ex), rubber (b), and surfactant(s) is generally at least 0.1% and up to and including 20%, or at least 0.1% and up to and including 15%. The monomer(s) can be present in an amount of at least 10% and up to and including 80%, or at least 20% and up to and including 50%, based on the total dry mass of the photosensitive layer composition. The useful amounts of initiator(s) include but are not limited to, at least 0.3 mass % and up to and including 5 mass %, or at least 0.5 mass % and up to and including 3 mass %, based on the total dry mass of the photosensitive layer composition.

The water-soluble or water-dispersible photosensitive layer is then designed, perhaps with routine trial and error, to have a front imaging layer that exhibits a controlled release of at least 5 g/cm and up to and including 500 g/cm, or at least 30 g/cm and up to and including 200 g/cm, or even at least 40 g/cm and up to and including 110 g/cm, as determined using ASTM D-3330 Method, with respect to the mask element (described below). This feature is demonstrated below in Invention Example 6.

Details about making such a photosensitive layer composition is provided in the art including for example, Col. 6 (lines 19-55) of U.S. Pat. No. 8,492,449 (noted above).

It is critical that the flexographic printing plate precursors used according to the present invention do not contain what may be known in the art as an "anti-tack" layer or anti-adhesion layer, for example, as such layers are described in Col. 8 (lines 3-10) of U.S. Pat. No. 8,492,449 (noted above).

Additionally, a protective layer (or cover sheet) can be placed over the front imaging surface of the photosensitive layer, which cover sheet generally contains one or more protective polymers. Generally, the cover sheet is transparent and has little tackiness before irradiation. It can be washed away or removed using the aqueous flexographic developers described above according to the present invention. Thus, the materials in the cover sheet are generally water-dispersible or water-soluble. Examples of polymers suitable for preparing this cover sheet include but are not limited to, polyamides and cellulose esters such as cellulose acetate butyrate and cellulose acetate propionate [see for example, see U.S. Pat. No. 6,030,749 (Takahashi et al.) in Cols. 4-8; and U.S. Pat. No. 9,005,884, noted above, Cols. 7-8), the disclosures of both of which are incorporated herein by reference. This cover sheet can be designed for ease of peeling off the photosensitive layer (see below) without damaging the front imaging surface of the photosensitive layer. The cover sheet design can be determined by routine experimentation using the teaching provided in the art.

It is also desirable that the water-soluble or water-dispersible photosensitive layer of the flexographic printing plate precursor has a controlled release of at least 5 g/cm and up to and including 500 g/cm as established by ASTM D-3330 Method D, between the photosensitive layer front imaging surface and the cover sheet. In addition, the cover sheet generally has a surface tension of less than 32 dynes/cm as determined, for example, using a Jemmco Accu-Flor dyne pen.

To carry out the present invention, a suitable flexographic printing plate precursor described above is used, which precursor consists essentially of a noted backing layer, a noted water-soluble or water-dispersible photosensitive layer having a backside imaging surface in contact (usually direct contact) with the backing layer; and a noted cover sheet directly in contact with the front imaging surface of the photosensitive layer.

Before imaging the photosensitive layer, the cover sheet is removed, usually by peeling it off the front imaging surface.

A mask element is generally obtained from a suitable non-silver halide imaging material such as those described in Cols. 4-12 of U.S. Pat. No. 8,945,813 (noted above) the details of which are incorporated by reference so they need not be repeated here. In its simplest form, a non-silver halide imaging material (sometimes known in the industry as a "Thermal Imaging Layer") comprises three essential layers: a transparent polymeric carrier sheet, a barrier layer, and a non-silver halide thermally-sensitive imageable layer. Other optional layers can be included if desired, including a transparent polymeric overcoat or spacer layer. An essential feature of the non-silver halide imaging material is the presence of one or more infrared radiation absorbing compounds in one or more layers to provide the desired thermal sensitivity.

In many embodiments, the mask element is a non-silver halide, thermally-sensitive film having a surface tension of at least 30 dynes/cm as determined using, for example, a Jemmco Accu-Flor dyne pen.

For example, the mask element can comprise one or more infrared radiation absorbing compounds, all dispersed within a polymeric binder that comprises one or more of a polyurethane, poly(vinyl butyral), (meth)acrylamide polymer, nitrocellulose, a poly(cyanoacrylate), polyacetal, or a polymer derived at least in part from any of methyl methacrylate, ethyl methacrylate, n-butyl methacrylate, and isobutyl methacrylate.

A mask element is then provided by producing exposed and non-exposed regions in the non-silver halide thermally-sensitive imageable layer using thermal radiation from a thermal or infrared laser that is scanned or rasterized under computer control. Any of the known scanning devices can be used including flat-bed scanners, external drum scanners, and internal drum scanners, in which the non-silver halide imageable material is secured to the drum or bed, and the laser beam is focused to a spot that can impinge on the non-silver halide imaging material. Two or more lasers can scan different regions simultaneously.

For example, a non-silver halide imageable material containing a suitable infrared radiation absorbing compound can be exposed to near-infrared or infrared radiation in the range of at least 700 nm and up to and including 1400 nm, while mounted on a suitable infrared imager using an infrared laser such as a diode laser or a Nd:YAG laser that can be scanned under computer control. Suitable infrared imagers include but are not limited to, TRENDSETTER imagesetters and ThermoFlex Flexographic CTP imagers (Eastman Kodak Company); DIMENSION imagesetters (Presstek); CYREL® Digital Imager (CDI SPARK, Esko-Graphics).

The step of forming a mask element can include removing either exposed or non-exposed regions of the non-silver halide thermally-sensitive imageable layer, leaving a mask image on the transparent carrier sheet.

In some embodiments, imagewise exposed or non-exposed regions can be transferred to a receiver sheet or receptor using means described in U.S. Pat. No. 8,945,813 (noted above, Cols. 13-15).

The mask element can be laminated directly in optical contact with the front imaging surface of the photosensitive layer using a suitable laminating device such as Flexcel NX Laminator (available from Eastman Kodak Company) and the standard conditions developed for use of each. Lamination is generally carried out so there is essentially no air gap between the mask element and the front imaging surface of the photosensitive layer, by applying pressure, or both heat and pressure. That is, an "air-free gap" or "air-free interface" is formed. As noted above, there is no anti-tack layer disposed between the mask element and the front imaging surface of the photosensitive layer. The two articles can be fed into the laminator at a suitable speed, temperature, and pressure. The result is an assembly of the mask element and flexographic printing plate precursor After the assembly of the two elements is formed, frontside exposure of the photosensitive layer to curing radiation is carried out through the mask element and front imaging surface to provide an exposed photosensitive layer having exposed regions and non-exposed regions in the photosensitive layer. Thus, the curing radiation is projected onto the photosensitive layer through the mask image that preferentially blocks the curing radiation in masked regions while allowing curing radiation through the non-masked regions, to harden or cure the photosensitive layer in those regions. The mask image should therefore be substantially opaque to the exposing or curing radiation in the masked regions, meaning that the mask element should have a transmission optical density of 2 or more. The non-masked (exposed) regions should be substantially transparent meaning that it should have a transmission optical density of 0.5 or less, or even 0.1 or less and no more than 0.3, as measured using a suitable filter on a densitometer (for example, a MACBETH TR 927 densitometer).

Generally, such front imaging surface exposure is accomplished by floodwise exposure from a suitable irradiation source (for example source of UV or visible radiation having a wavelength of at least 150 nm and up to and including 700 nm) and many such sources are commercially available (see various sources described in Col. 16 (lines 41ff) of U.S. Pat. No. 8,945,813 (noted above). Optimal time and temperature for this exposure is known in the art.

In some embodiments, before the frontside imaging exposure is carried out, the photosensitive layer of the precursor can be subjected to a backside uniform exposure through the backing film to prepare a thin, uniformly cured layer on the backside imaging surface of the photosensitive layer. This backside exposure can be carried out either before or after the lamination with the mask element is carried out. Such backside exposure can be carried out using the same or different exposing means described above for the front imaging surface exposure. Optimal time and temperature for this exposure is known in the art.

After all exposures have been carried out, the exposed photosensitive layer can be processed using a suitable aqueous flexographic developer and conditions described herein to remove non-exposed regions from the exposed photosensitive layer.

In general, the method can also include removing the mask element from the exposed precursor containing the exposed photosensitive layer before this processing is carried out. This can be done using any suitable manner, such as peeling the two elements apart in a manner that does not damage the exposed photosensitive layer of the exposed flexographic printing plate precursor.

An aqueous flexographic developer according to the present invention can be applied to an exposed flexographic printing plate precursor in any suitable manner including but not limited to spraying, brushing, rolling, dipping (immersing), or any combination thereof. This removes uncured or non-polymerized material from the non-exposed regions of the photosensitive layer.

This processing is typically carried out using a working strength aqueous flexographic developer according to the present invention that is provided as manufactured, but more likely is provided by dissolving or dilution of a flexographic developer concentrate according to the present invention. An acceptable dilution rate of a concentrate in liquid form is mixing 1 part of the concentrate with at least 2 parts and up to and including 99.8 parts of water, or more likely at least 20 parts and up to and including 99 parts of water.

Development or processing can be carried out at a temperature of at least 30° C. and up to and including 60° C. The specific development conditions will be dictated by the type of apparatus used and the specific concentration of components in the aqueous flexographic developer.

During processing, evaporation and resulting flexographic printing members can carry away some of the water in the working strength aqueous flexographic developer. As a result, the development strength (activity) of usefulness of various components can be diminished. It can be useful then to "replenish" the working strength aqueous flexographic developer with a replenisher developer composition that has the same or a greater concentration of the one or more of the essential components a) through c) and any optional components as the original working strength aqueous flexographic developer. A skilled worker would be able to formulate a suitable replenisher developer composition for a given apparatus and processing through put.

When a flexographic developer concentrate, in liquid form, is supplied to the processing apparatus and appropriately diluted as described above to form an aqueous flexographic developer, a replenisher developer composition can be supplied to the processing apparatus using known procedures and apparatus features. Alternatively, or in addition to this described replenishment procedure, the flexographic developer concentrate (in liquid form) also can be replenished before the dilution process using a replenisher developer concentrate that can have the same or different concentration of components a) through c) and any optional components, as the "original" flexographic developer concentrate.

Particularly useful processing methods, apparatus, and systems useful in carrying out the present invention are described in U.S. Ser. Nos. 15/196,122 and 15/196,132 (both noted above).

In can be desirable to carry out the noted processing of an exposed photosensitive layer while it is being subjected to mechanical cleaning using suitable cleaning devices such as flat or rotary brushes or composed of nylon. Such mechanical cleaning can be carried out with or without washing with a secondary aqueous processing solution such as water or an aqueous solution of a suitable cleaning surfactant at a suitable temperature. All mechanical cleaning and washing operations can be followed by washing the resulting flexographic printing plate having a relief image with water for a suitable time and at a suitable temperature.

Post-developing processing of the relief image in the flexographic printing plate may be desirable under some circumstances. Typical post-development processing includes drying the relief image to remove any excess aqueous flexographic developer and washing solutions and post-curing by exposing the relief image to curing radiation to cause further hardening or crosslinking of the relief image. The conditions for these processes are well known to those skilled in the art. For example, the relief image may be blotted or wiped dry or dried in a forced air or infrared oven. Drying times and temperatures would be readily apparent to one skilled in the art.

Detackification can be carried out if the flexographic printing plate is still tacky after drying. Such treatments, for example, by treatment with bromide or chlorine solutions or exposure to UV or visible radiation, are well known to a skilled artisan.

The resulting relief image may have a depth of from about 2% to about 100% (typically from about 10 to about 80%) of the original thickness of the water-soluble or water-dispersible photosensitive layer in the flexographic printing plate precursor. When the water-soluble or water-dispersible photosensitive layer composition is disposed on a non-photosensitive backing film, up to 100% of it can be removed in part or all of the relief image. The relief image depth can be from about 150 to about 2000 μm.

The flexographic printing plates can be used to advantage in the formation of seamless, continuous flexographic printing webs, or they can be formed as flat sheets that can be wrapped around a cylinder form.

The present invention provides at least the following embodiments and combinations thereof, but other combinations of features are considered to be within the present invention as a skilled artisan would appreciate from the teaching of this disclosure:

1. A method for forming a flexographic printing plate, comprising:
   A) providing a flexographic printing plate precursor consisting essentially of:
      a backing film,
      a water-soluble or water-dispersible photosensitive layer comprising a photosensitive resin composition and having a front imaging surface and a backside imaging surface that is in contact with the backing film, and
      a cover sheet directly in contact with the front imaging surface;
   B) removing the cover sheet from the front imaging surface of the photosensitive layer;
   C) laminating a mask element directly in contact with the front imaging surface of the water-soluble or water-dispersible photosensitive layer;
   D) frontside imagewise exposing the photosensitive layer through the mask element and front imaging surface to provide an exposed photosensitive layer having exposed regions and non-exposed regions; and
   E) processing the exposed photosensitive layer to remove non-exposed regions in the exposed photosensitive layer, using an aqueous flexographic developer having a pH of at least 9 and up to and including 12 and comprising:
      a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 0.25 weight % and up to and including 2.0 weight %;
      wherein at least 85 weight % of the fatty acid composition is composed of one or more $C_{18}$ mono- or polyunsaturated fatty acids or alkali metal salts thereof;
      b) one or more aminopolycarboxylic acids or alkali metal salts thereof in an amount of at least 0.05 weight % and up to and including 0.30 weight %;
      c) a buffer compound in an amount of at least 0.05 weight % and up to and including 0.60 weight %; and
      d) water in an amount of at least 97 weight % and up to and including 99.5 weight %;
      all amounts being based on the total weight of the aqueous flexographic developer,
      to provide a flexographic printing plate with a relief image,
      wherein the water-soluble or water-dispersible photosensitive layer has a controlled release of at least 5 g/cm and up to and including 700 g/cm as established by ASTM D-3330 Method D, between the front imaging surface and the mask element.

2. The method of embodiment 1, wherein the mask element is a non-silver halide, thermally-sensitive film having a surface tension of at least 30 dynes/cm.

3. The method of embodiment 1 or 2, wherein the mask element comprises one or more infrared radiation absorbing compounds, all dispersed within a polymeric binder that comprises one or more of a polyurethane, poly(vinyl butyral), (meth)acrylamide polymer, nitrocellulose, a poly(cyanoacrylate), polyacetal, or a polymer derived at least in part from any of methyl methacrylate, ethyl methacrylate, n-butyl methacrylate, and isobutyl methacrylate.

4. The method of any of embodiments 1 to 3, wherein the water-soluble or water-dispersible photosensitive layer has a controlled release of at least 5 g/cm and up to and including 500 g/cm as established by ASTM D3330 Method D, between the front imaging surface and the cover sheet.

5. The method of embodiment 4, wherein the cover sheet has a surface tension of less than 32 dynes/cm.

6. The method of any of embodiments 1 to 5, wherein the water-soluble or water-dispersible photosensitive layer has a controlled release of at least 30 g/cm and up to and including 200 g/cm as established by ASTM D-3330 Method D, between the front imaging surface and the mask element.

7. The method of any of embodiments 1 to 6, wherein the water-soluble or water-dispersible photosensitive layer has a controlled release of at least 40 g/cm and up to and including 110 g/cm as established by ASTM D-3330 Method D, between the front imaging surface and the mask element.

8. The method of any of embodiments 1 to 7, wherein the aqueous flexographic developer consists essentially of oleic acid or an alkali metal salt thereof in an amount of at least 85 weight % and up to and including 90 weight %, based on the total weight of the fatty acid composition.

9. The method of any of embodiments 1 to 8, wherein the buffer compound is a carbonate.

10. The method of any of embodiments 1 to 9, wherein the fatty acid composition is present in an amount equal to or less than 1.25 weight % based on the total weight of the aqueous flexographic developer.

11. The method of any of embodiments 1 to 10, wherein the aminopolycarboxylic acids or alkali metal salts is an ethylenediamine tetracarboxylic acid or an alkali metal salt thereof in an amount of at least 0.05 weight % and up to and including 0.30 weight %, based on the total weight of the aqueous flexographic developer.

12. The method of any of embodiments 1 to 11, further comprising, prior to the frontside imagewise exposing, uniformly exposing the photosensitive layer through the backside imaging surface.

13. The method of any of embodiments 1 to 12, wherein processing the exposed photosensitive layer is carried out while the exposed photosensitive layer is subjected to mechanical cleaning.

14. The method of any of embodiments 1 to 13, further comprising:

further subjecting the flexographic printing plate with the relief image to mechanical cleaning, with or without washing with a secondary aqueous processing solution.

15. The method of embodiment 14, further comprising:

washing the flexographic printing plate with the relief image with water after the mechanical cleaning and after any washing with the secondary aqueous processing solution.

16. The method of any of embodiments 1 to 15, wherein processing with the aqueous flexographic developer is carried out at a temperature of at least 40° C. and up to and including 60° C.

The following Examples are provided to illustrate the practice of this invention and are not meant to be limiting in any manner. Unless otherwise indicated, the materials used in the working examples were obtained from various commercial sources.

Comparative Example 1

A flexographic developer concentrate was prepared outside of the present invention by allowing a fatty acid mixture to react with potassium hydroxide. Glycerin was added and the pH was adjusted to 9.8. Water was added to bring the solids concentration to 21 weight %. The final flexographic developer concentrate had the following components and amounts (weight %):

| Lauric acid | 4.03% |
|---|---|
| Myristic acid | 1.47% |
| Palmitic acid | 1.31% |
| Steric acid | 0.88% |
| Oleic acid | 8.28% |
| Linoleic acid | 0.58% |
| Potassium hydroxide | 3.72% |
| Glycerin | 0.73% |
| Water | 79.00% |

This flexographic developer concentrate was made into an aqueous flexographic developer (working strength solution) by diluting 1 part of the noted flexographic developer concentrate with 42 parts of water to provide an aqueous flexographic developer having a total amount of saturated and unsaturated fatty acid, fatty acid salts, and glycerin of 0.5 weight %, and a pH of 9.5. The resulting aqueous flexographic developer was placed in an orbital processor unit and used to process exposed flexographic printing plates like those described in U.S. Pat. No. 8,492,449 (noted above), except such precursors contained no anti-adhesive (anti-tack) layer over the photosensitive layer, using known conditions and procedures for such flexographic printing plate precursors. The amount of debris on the processed flexographic printing plates was evaluated and assigned a numerical value between 1 and 5 with 1 meaning no debris and 5 meaning an unacceptable amount of debris.

Invention Example 1

A flexographic developer concentrate was prepared according to the present invention by allowing a fatty acid mixture to react with potassium hydroxide. The pH was adjusted to 10.6 and water was added to bring the solids concentration to 21 weight %. The final flexographic developer concentrate had the following components and amounts:

| Palmitic acid | 0.04% |
|---|---|
| Steric acid | 0.46% |
| Oleic acid | 15.77% |
| Linoleic acid | 1.24% |
| Linolenic acid | 0.02% |
| Potassium hydroxide | 3.48% |
| Water | 79.00% |

One part of this concentrate was diluted with 42 parts of water to provide an aqueous flexographic developer having a total fatty acid and fatty acid salt concentration of 0.5 weight % and a pH of 10.5. The resulting aqueous flexographic developer was placed in an orbital processor unit and used to process exposed flexographic printing plate precursors as described above in Comparative Example 1, using known conditions and procedures. The amount of debris on the processed flexographic printing plates was evaluated and assigned a numerical value as described for Comparative Example 1.

Invention Example 2

A flexographic developer concentrate was prepared according to the present invention by allowing a fatty acid mixture to react with potassium hydroxide. Potassium carbonate was added and the pH was adjusted to 10.6. Water was added to bring the solids concentration to 21 weight %. The final flexographic developer concentrate had the following components and amounts:

| Palmitic acid | 0.03% |
|---|---|
| Steric acid | 0.33% |
| Oleic acid | 11.19% |
| Linoleic acid | 0.88% |
| Linolenic acid | 0.01% |
| Potassium hydroxide | 2.47% |
| Potassium carbonate | 6.09% |
| Water | 79.00% |

One part of the resulting flexographic developer concentrate was diluted with 42 parts of water to provide an aqueous flexographic developer having a total fatty acid and fatty acid salt amount of 0.5 weight % and a pH of 10.5.

This aqueous flexographic developer was placed in an orbital processor unit and used to process exposed flexographic printing plate precursors as described above in Comparative Example 1, using known conditions and procedures. The amount of debris on the processed flexographic printing plates was evaluated and assigned a numerical value as described for Comparative Example 1.

Invention Example 3

A flexographic developer concentrate was prepared according to the present invention by allowing a fatty acid mixture to react with potassium hydroxide. Potassium carbonate and EDTA disodium salt were added and the pH was adjusted to 10.6. Water was added to bring the solids concentration to 21 weight %. The final flexographic developer concentrate had the following components and amounts:

| Palmitic acid | 0.02% |
| Steric acid | 0.29% |
| Oleic acid | 10.00% |
| Linoleic acid | 0.79% |
| Linolenic acid | 0.01% |
| Potassium hydroxide | 2.21% |
| Potassium carbonate | 5.44% |
| EDTA disodium salt | 2.25% |
| Water | 79.00% |

One part of the resulting flexographic developer concentrate was diluted with 42 parts of water to provide an aqueous flexographic developer having a total fatty acids and fatty acid salts content of 0.5 weight % and a pH of 10.5.

The aqueous flexographic developer was placed in an orbital processor unit and used to process exposed flexographic printing plate precursors as described above in Comparative Example 1, using known conditions and procedures. The amount of debris on the processed flexographic printing plates was evaluated and assigned a numerical value as described for Comparative Example 1.

Invention Example 4

A flexographic developer concentrate was prepared according to the present invention by allowing a fatty acid mixture to react with potassium hydroxide. Potassium carbonate, EDTA disodium salt, and DOWANOL® PnB co-solvent were added. The pH was adjusted to 10.6 and water was added to bring the solids concentration to 21 weight %. The final flexographic developer concentrate had the following make up:

| Palmitic acid | 0.02% |
| Steric acid | 0.26% |
| Oleic acid | 9.03% |
| Linoleic acid | 0.71% |
| Linolenic acid | 0.01% |
| Potassium hydroxide | 1.99% |
| DOWANOL ® PnB | 2.03% |
| Potassium carbonate | 4.91% |
| EDTA disodium salt | 2.03% |
| Water | 79.00% |

One part of the resulting flexographic developer concentrate was diluted with 199 parts of water to provide an aqueous flexographic developer having a total fatty acid salts content of 0.5 weight % and a pH of 10.5.

The resulting aqueous flexographic developer was placed in an orbital processor unit and used to process exposed flexographic printing plate precursors as described above in Comparative Example 1, using known conditions and procedures. The amount of debris on the processed flexographic printing plates was evaluated and assigned a numerical value as described for Comparative Example 1.

Evaluation of Debris Levels on Processed Flexographic Printings:

The flexographic printing plate precursors described above were exposed in a standard fashion using a FLEXEL mask element and lamination system with the same standard back exposures and main exposures. The exposed precursors were processed using an orbital brush processor that is commonly used in the industry. The debris level for each processed flexographic printing plate was evaluated under a light microscope. A higher level of debris was given a higher score as described above, and the higher the amount of debris, the worse the printing results.

The following results were determined for the Examples described above:

| | Average Debris Score | | |
| Example | Plates 1-5 | 5-10 | 10-15 |
| --- | --- | --- | --- |
| Comparative 1 | 1.6 | 1.7 | 2.2 |
| Invention 1 | 1.2 | 1.5 | 1.8 |
| Invention 2 | 0.9 | 0.9 | 1.0 |
| Invention 3 | 0.75 | 1.0 | 1.0 |
| Invention 4 | 0.80 | 0.95 | 1.0 |

Comparison of the Debris Levels on Printing Plates Prepared Using Comparative Example 1 and Invention Example 4:

A number of imagewise exposed flexographic printing plate precursors were processed in the processing unit as described above. As the number of flexographic printing plate precursors being processed increased, the amount of debris from the non-exposed material in the aqueous flexographic developer increased, leading to increased debris on the finished flexographic printing plates. FIG. 1 shows the debris level observed vs. the number of flexographic printing plates that were processed using the aqueous flexographic developers of both Comparative Example 1 and Invention Example 4. The observed debris was found on the resulting flexographic printing plates. The solid line data represent the results obtained using Comparative Example 1 and the dashed line data represent the results obtained using Invention Example 4. Both illustrated lines represent an average of the respective data points wherein each datum point represents an individual processed flexographic printing plate.

It is evident that while observed debris increased as the number of processed flexographic printing plates was increased in both compositions (that is, as the aqueous developer composition was "seasoned" from use), the Invention Example 4 aqueous flexographic developer provided a reduction in debris formation as the number of processed flexographic printing plates increased, compared to the aqueous developer composition of Comparative Example 1.

Invention Example 5

A flexographic developer concentrate was prepared according to the present invention containing the following components and had a pH of 10.6. No saturated fatty acids (or alkali metal salts thereof) were included and the fatty acid composition contained only potassium oleate.

Potassium oleate at 54.9 weight %;
Potassium carbonate at 23.1 weight %;
EDTA di sodium salt at 10.0 weight %; and
Propylene glycol n-butyl ether at 11.0 weight %.

Comparative Example 2

A flexographic developer concentrate was prepared outside of the present invention but according to the teaching in U.S. Pat. No. 9,005,884 (noted above) in which the weight ratio of unsaturated fatty acids (or alkali metal salts thereof) to saturated fatty acids (or alkali metal salts thereof) was 80:20. The concentrate components were as follows and the concentrate had a pH of 10.6:
Potassium oleate (mono-unsaturated) at 79.4 weight %;
Potassium Stearate (saturated) at 20.1 weight %; and
Potassium Hydroxide at 0.5 weight %.

Comparative Example 3

Another flexographic developer concentrate was prepared outside of the present invention but according to the teaching in U.S. Pat. No. 9,005,884 (noted above) in which the weight ratio of unsaturated fatty acids (or alkali metal salts thereof) to saturated fatty acids (or alkali metal salts thereof) was 20:80. The concentrate had a pH of 10.7 and its components were as follows:
Potassium Oleate at 20.1 weight %;
Potassium Stearate at 79.4 weight %; and
Potassium Hydroxide at 0.5 weight %.

Each of the concentrates of Invention Example 5 and Comparative Examples 2 and 3 were used to make working strength aqueous flexographic developers by diluting one part of each with 116.6 parts of water to provide 0.85 weight % solids. The resulting working strength aqueous flexographic developers had a pH of 10.4, 10.5, and 10.5, respectively.

Samples of flexographic printing plates as described in Comparative Example 1 were backside imaging surface exposed at each of 30 seconds, 45 seconds, 60 seconds, and 75 seconds using a Mekrom Concept 302 EDLF exposure unit to establish a "plate floor" (Plate 1). A section of each flexographic printing plate precursor sample that had been exposed at 75 seconds was given a frontside imaging exposure ("main exposure") of 8 minutes to provide a fully exposed printing "plate ceiling".

Each exposed flexographic printing plate precursor was then processed (developed) with each of the working strength aqueous flexographic developers of Invention Example 5 and Comparative Examples 2 and 3 in a Takano A-Flexo A2W Plate Processor for 4 minutes at 54° C. By subtracting the thickness of the plate floor from the thickness of the plate ceiling, a flexographic printing plate relief image value was obtained for the various back exposures and a backside exposure value for a desired relief value was determined.

Using the values determined above for the aqueous flexographic developers of Invention Example 5 and Comparative Examples 2 and 3, flexographic printing plates (precursors) like those described in Comparative Example 1 were back exposed. These flexographic printing plates were then exposed imagewise with a main exposure of various times (Plate 2) and processed as described above using the aqueous flexographic developers of Invention Example 5 and Comparative Examples 2 and 3, respectively. By examining the quality of the features from the main exposure values, an optimal main exposure was determined for each aqueous flexographic developer.

Six additional samples of the noted flexographic printing plate precursors ($3^{rd}$ through $8^{th}$ plates) were processed without exposure using each of the three aqueous flexographic developers to increase the amount of solid material in each processing bath.

Two more samples of the flexographic printing plate described above in Comparative Example 1 ("$9^{th}$ and $10^{th}$ plates") were each exposed using a test pattern and a main exposure value that encompassed the determined optimum values (as determined using plates 1 and 2 described above, as shown below in TABLE I). The level of debris on each of the $9^{th}$ and $10^{th}$ plates was examined and assigned a relative value from 1.0 to 6.0 with 1.0 being good. The initial pH of each aqueous flexographic developer was measured, the respective decreased pH values were measured after processing of the $10^{th}$ plate, and the absolute pH difference was determined. The results of this experimentation are shown in the following TABLE I.

TABLE I

| Developer Example | Backside Exposure Value (seconds) | Main Exposure Value $9^{th}$ plate (minutes) | Main Exposure | Debris Level $9^{th}$ plate | Debris Level $10^{th}$ plate | pH Change |
| --- | --- | --- | --- | --- | --- | --- |
| Invention 5 | 57 | 12 | 14 | 0.8 | 1.0 | 0.35 |
| Comparative 2 | 65 | 11 | 12 | 4.9 | 5.4 | 0.75 |
| Comparative 3 | 69 | 11 | 12 | 4.6 | 5.1 | 1.6 |

The results shown in TABLE I indicate that the debris level for plates 9 and 10 and the pH change of the aqueous flexographic developer of Invention Example 5 are much lower than for the aqueous flexographic developers of Comparative Examples 2 and 3.

Invention Example 6 and Comparative Example 4

These examples are presented to show an evaluation of controlled release according to the present invention. In the evaluations of the inventive and comparative flexographic printing plate precursors described below, peel force (controlled release) was measured by following the procedure outlined in the standard test of ASTM D-3330 Method D.

Experiments were carried out by imaging samples of Kodak Ultra NX Thermal Imaging Layer R ("mask element precursor" described for example in U.S. Pat. No. 9,250,257 (Kidnie), the disclosure of which is incorporated herein by reference, using a commercially available Kodak Flexcel NX Imaging device and a standard test image consisting of various test patterns, thereby forming mask elements.

For Invention Example 6, the precursor was a flexographic printing plate precursor (having a photosensitive layer composed for example as described in U.S. Pat. No. 8,492,449, noted above). For Comparative Example 4, the precursor was a commercially available Toyobo Cosmolight NS170F plate (comprising an anti-tack layer on the front imaging surface of the photosensitive layer).

The imaged elements (mask elements) were each laminated to the front imaging surface of each flexographic printing plate precursor ("precursor", identified above) from which any cover sheet had been removed, and each having a backing film composed of poly(ethylene terephthalate) on the backside imaging surface, and a water-soluble or water-dispersible photosensitive layer ("photosensitive layer") comprising a photosensitive resin composition, as described for example in U.S. Pat. No. 8,492,449 (noted above). Lamination was carried out using a Flexel Wide 5080 Laminator with standard settings to bring the mask element is direct contact with the front imaging surface of the photosensitive layer of the precursor.

Each laminated mask element and precursor were then uniformly exposed through the backside imaging surface of the photosensitive layer, followed by a frontside imagewise exposure of the photosensitive layer through the mask element, using a Kodak Ultra NX processing unit using times that are appropriate for the precursor used. A 2 inch (5 cm) by 2 inch (5 cm) piece was cut out of each combination of laminated and exposed articles to use in the peel test for which the precursor was adhered to a stainless steel plate using 3M® brand double-sided clear adhesive tape E1120H. The peel force (in grams) was measured using an IMASS Adhesion Tester SP-2100 (available from Imass, Inc., Hingham, Mass.) that was equipped with a 5 kg load, a peel angle of 180°, and a peel rate of 90 inches/minute (228.6 cm/minute). The measurements were averaged over 5 seconds and a 0.5 second delay.

The following TABLE II shows the results of the peel test for each precursor:

TABLE II

| Example | Peel Force (g/cm) |
|---|---|
| Invention 6 | 56.5 |
| Comparative 4 | 1.6 |

The results shown in TABLE II demonstrate that the photosensitive printing plate precursor having no anti-tack layer and having a photosensitive layer in intimate (direct) contact with the mask element exhibited a higher degree of adhesion (peel force or controlled release).

Others samples of the inventive and comparative precursors were laminated to the mask element, similarly backside and frontside exposed, and processed using the aqueous flexographic developer described above in Invention Examples 1-3. The resulting relief images were evaluated using DigiCap pattern grading wherein values of 0 or 1 are excellent, values greater than 3 are unacceptable, and a value of 6 indicates that a DigiCap pattern was not present. The results of these tests are shown in the following TABLE III:

TABLE III

| Example | DigiCap Value |
|---|---|
| Invention 6 | 0.5 |
| Comparative 4 | 6 |

The results indicate that the precursor used in Comparative Example 6 provided a very unacceptable DigiCap pattern wherein the inventive precursor DigiCap pattern was highly acceptable. This indicates that the inventive precursor (without an anti-tack layer) exhibited the desired controlled release (peel force) with the mask element. When an anti-tack layer is present on the front imaging surface of the precursor, there is insufficient adhesion for the combination of mask element and precursor during lamination, and delamination can readily occur during handling of the combination of articles. These results demonstrated that the water-soluble or water-dispersible photosensitive layer of a precursor shown have a controlled release of at least 25 g/cm and less than 700 g/cm as established by ASTM D-3330 Method D between the front imaging surface of the precursor and the mask element.

The invention has been described in detail with particular reference to certain preferred embodiments thereof, but it will be understood that variations and modifications can be effected within the spirit and scope of the invention.

The invention claimed is:

1. A method for forming a flexographic printing plate, comprising:
   A) providing a flexographic printing plate precursor consisting essentially of:
      a backing film,
      a water-soluble or water-dispersible photosensitive layer comprising a photosensitive resin composition and having a front imaging surface and a backside imaging surface that is in contact with the backing film, and
      a cover sheet directly in contact with the front imaging surface;
   B) removing the cover sheet from the front imaging surface of the photosensitive layer;
   C) laminating a mask element directly in contact with the front imaging surface of the water-soluble or water-dispersible photosensitive layer;
   D) frontside imagewise exposing the photosensitive layer through the mask element and front imaging surface to provide an exposed photosensitive layer having exposed regions and non-exposed regions; and
   E) processing the exposed photosensitive layer to remove non-exposed regions in the exposed photosensitive layer at a temperature of at least 40° C. and up to and including 60° C., using an aqueous flexographic developer having a pH of at least 9 and up to and including 12 and comprising:
      a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 0.25 weight % and up to and including 2.0 weight %;
      wherein at least 85 weight % of the fatty acid composition is composed of one or more $C_{18}$ mono- or poly-unsaturated fatty acids or alkali metal salts thereof;
      b) one or more aminopolycarboxylic acids or alkali metal salts thereof in an amount of at least 0.05 weight % and up to and including 0.30 weight %;
      c) a buffer compound in an amount of at least 0.05 weight % and up to and including 0.60 weight %; and
      d) water in an amount of at least 97 weight % and up to and including 99.5 weight %;
      all amounts being based on the total weight of the aqueous flexographic developer,
      to provide a flexographic printing plate with a relief image,
      wherein the water-soluble or water-dispersible photosensitive layer has a peel force of at least 5 g/cm and up to and including 700 g/cm as determined using the procedure of ASTM D-3330 Method D, between the front imaging surface and the mask element.

2. The method of claim 1, wherein the mask element is a non-silver halide, thermally-sensitive film having a surface tension of at least 30 dynes/cm.

3. The method of claim 1, wherein the mask element comprises one or more infrared radiation absorbing compounds, all dispersed within a polymeric binder that comprises one or more of a polyurethane, poly(vinyl butyral), (meth)acrylamide polymer, nitrocellulose, a poly(cyanoacrylate), polyacetal, or a polymer derived at least in part from any of methyl methacrylate, ethyl methacrylate, n-butyl methacrylate, and isobutyl methacrylate.

4. The method of claim 1, wherein the water-soluble or water-dispersible photosensitive layer has a peel force of at least 5 g/cm and up to and including 500 g/cm as determined using the procedure of ASTM D3330 Method D, between the front imaging surface and the cover sheet.

5. The method of claim 4, wherein the cover sheet has a surface tension of less than 32 dynes/cm.

6. The method of claim 1, wherein the water-soluble or water-dispersible photosensitive layer has a peel force of at least 30 g/cm and up to and including 200 g/cm as determined using the procedure of ASTM D-3330 Method D, between the front imaging surface and the mask element.

7. The method of claim 1, wherein the water-soluble or water-dispersible photosensitive layer has a peel force of at least 40 g/cm and up to and including 110 g/cm as determined using the procedure of ASTM D-3330 Method D, between the front imaging surface and the mask element.

8. The method of claim 1, wherein the aqueous flexographic developer consists essentially of oleic acid or an alkali metal salt thereof in an amount of at least 85 weight % and up to and including 90 weight %, based on the total weight of the fatty acid composition.

9. The method of claim 1, wherein the buffer compound is a carbonate.

10. The method of claim 1, wherein the fatty acid composition is present in an amount equal to or less than 1.25 weight % based on the total weight of the aqueous flexographic developer.

11. The method of claim 1, wherein the aminopolycarboxylic acids or alkali metal salts is an ethylenediamine tetracarboxylic acid or an alkali metal salt thereof in an amount of at least 0.05 weight % and up to and including 0.30 weight %, based on the total weight of the aqueous flexographic developer.

12. The method of claim 1, further comprising, prior to the frontside imagewise exposing, uniformly exposing the photosensitive layer through the backside imaging surface.

13. The method of claim 1, wherein processing the exposed photosensitive layer is carried out while the exposed photosensitive layer is subjected to mechanical cleaning.

14. The method of claim 1, further comprising:
further subjecting the flexographic printing plate with the relief image to mechanical cleaning, with or without washing with a secondary aqueous processing solution.

15. The method of claim 14, further comprising:
washing the flexographic printing plate with the relief image with water after the mechanical cleaning and after any washing with the secondary aqueous processing solution.

* * * * *